(12) United States Patent  (10) Patent No.: US 7,778,345 B2
Sperlich et al.  (45) Date of Patent: Aug. 17, 2010

(54) DISTORTION COMPENSATION IN A COMMUNICATION SYSTEM

(75) Inventors: Roland Sperlich, Dallas, TX (US); Gregory C. Copeland, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 481 days.

(21) Appl. No.: 11/936,551

(22) Filed: Nov. 7, 2007

(65) Prior Publication Data

US 2009/0116578 A1   May 7, 2009

(51) Int. Cl.
*H04B 15/00* (2006.01)
*H04B 1/10* (2006.01)
*H04L 25/49* (2006.01)

(52) U.S. Cl. .................. 375/285; 375/296; 375/346

(58) Field of Classification Search ................ 375/219, 375/285, 295, 296, 297, 316, 346; 455/84, 455/85, 86, 91, 114.2, 114.3, 130; 332/103, 332/106, 107, 123, 124; 329/304, 318, 347, 329/349, 351, 353
See application file for complete search history.

(56) References Cited

U.S. PATENT DOCUMENTS

| 5,937,006 | A | 8/1999 | Clark et al. |
| 6,714,776 | B1 | 3/2004 | Birleson |
| 6,757,525 | B1 | 6/2004 | Ishikawa et al. |
| 6,831,954 | B1 | 12/2004 | Mandyam |
| 2003/0156658 | A1 | 8/2003 | Dartois |
| 2004/0203472 | A1* | 10/2004 | Chien .......................... 455/68 |
| 2005/0062531 | A1 | 3/2005 | Schreyer et al. |
| 2005/0271164 | A1 | 12/2005 | Moulthrop et al. |
| 2006/0007999 | A1 | 1/2006 | Gomez et al. |
| 2006/0008030 | A1 | 1/2006 | Luke et al. |
| 2006/0019617 | A1 | 1/2006 | Sorrells et al. |
| 2006/0128338 | A1 | 6/2006 | Kerth et al. |
| 2006/0281429 | A1 | 12/2006 | Kishi et al. |
| 2007/0049205 | A1 | 3/2007 | Moloudi et al. |
| 2007/0135064 | A1 | 6/2007 | Ruelke et al. |
| 2007/0275674 | A1* | 11/2007 | Chien ........................ 455/90.2 |

* cited by examiner

*Primary Examiner*—Tesfaldet Bocure
(74) *Attorney, Agent, or Firm*—John J. Patti; Wade J. Brady, III; Frederick J. Telecky, Jr.

(57) ABSTRACT

In one embodiment of the invention, a modulator mixes a transmit-path signal based on a local oscillator (LO) signal and an amplifier amplifies the mixed transmit-path signal to generate an output signal for transmission. A demodulator generates a receive-path signal based on the output signal and the LO signal. Phase-shift control components provide the output signal and the LO signal to the demodulator during a first time duration and provide a phase-shifted version of one of the output signal and the LO signal to the demodulator during a second time duration. The demodulator generates a second receive-path signal based on the one of the phase-shifted output signal and the phase-shifted LO signal during the second time duration. At least one predistortion circuit adjusts at least one of the transmit-path signal and the receive-path signal based on a difference in signal characteristics of the receive-path signal during the second time duration relative to the first time duration.

20 Claims, 5 Drawing Sheets

DISTORTION COMPENSATION IN A COMMUNICATION SYSTEM

TECHNICAL FIELD

This invention relates to electronic circuits and, more specifically, to distortion compensation in a communication system.

BACKGROUND

The demand for wireless communication of voice and data is constantly increasing. Some wireless communication devices can include a transceiver that implements a direct upconversion and downconversion system. Direct upconversion describes a system in which an information-carrying baseband signal is mixed directly with a high-frequency local oscillator (LO) carrier signal. The combined radio frequency (RF) signal is amplified and transmitted from the wireless communication device. Likewise, direct downconversion describes a system in which a received RF signal is downconverted by using an LO to remove the carrier signal from the received RF signal to obtain the information carrying baseband signal. In either case, the baseband signal can be split into both in-phase (I) and quadrature-phase (Q) components.

A single LO is often employed for both upconversion and downconversion in a transceiver to maintain simplicity of the design, such that cost and size can both be reduced. However, the implementation of a single LO can result in distortion that is based on an imbalance of the gain and/or phase of the I- and Q-components of the signal. This imbalance can often greatly increase the need for expensive filters. Such an imbalance can be corrected through manual calibration that is often implemented on a trial-and-error basis. However, it is difficult to ascertain where the distortion is being introduced into the system. In addition, temperature and semiconductor aging can also result in dynamic distortion of a transceiver, such that the manual calibration is insufficient to provide long term correction of imbalance of the I- and Q-components of the transmitted and received signals.

SUMMARY

In one embodiment of the invention, a modulator mixes a transmit-path signal based on a local oscillator (LO) signal and an amplifier amplifies the mixed transmit-path signal to generate an output signal for transmission. A demodulator generates a receive-path signal based on the output signal and the LO signal. Phase-shift control components provide the output signal and the LO signal to the demodulator during a first time duration and provide a phase-shifted version of one of the output signal and the LO signal to the demodulator during a second time duration. The demodulator generates a second receive-path signal based on the one of the phase-shifted output signal and the phase-shifted LO signal during the second time duration. At least one predistortion circuit adjusts at least one of the transmit-path signal and the receive-path signal based on a difference in signal characteristics of the receive-path signal during the second time duration relative to the first time duration.

Another embodiment of the invention includes a method for correcting in-phase and quadrature-phase imbalance associated with at least one of a transmit-path signal and a receive-path signal. The method comprises mixing the transmit-path signal with a LO signal to generate an RF signal and amplifying the RF signal to generate an output signal for transmission. The method also includes reverse-mixing the output signal to generate a first receive-path signal based on the LO signal and monitoring signal characteristics associated with the first receive-path signal. The method also includes reverse-mixing one of the output signal based on a phase-shifted version of the LO signal and a phase-shifted version of the output signal based on the LO signal to generate a second receive-path signal, and monitoring signal characteristics associated with the second receive-path signal. The method further includes adjusting at least one of the transmit-path signal and the receive-path signal based on a difference in the monitored signal characteristics of the first receive-path signal and the monitored signal characteristics of the second receive-path signal.

Another embodiment of the invention includes a communication system. The communication system comprises means for mixing a transmit-path signal with an LO signal to generate an RF signal and means for amplifying the RF signal to generate an output signal. The system also comprises means for reverse-mixing the output signal based on the LO signal to generate a receive-path signal during a first time duration and for reverse-mixing one of the output signal based on a phase-shifted version of the LO signal and a phase-shifted version of the output signal based on the LO signal to generate the receive-path signal during a second time duration. The system also comprises means for monitoring signal characteristics associated with the receive-path signal during the first time duration and the second time duration, and means for adjusting at least one of the transmit-path signal and the receive-path signal based on a difference in the signal characteristics of the receive-path signal during the second time duration relative to the first time duration.

DETAILED DESCRIPTION

The invention relates to electronic circuits and, more specifically, to distortion compensation in a communication system. A digital signal processor (DSP) can monitor digital signal streams in a receive-path of a communication system. As an example, the DSP can control which of two local oscillator (LO) signals are utilized to demodulate the received signal that is fed back from the amplified transmit signal. The two LO signals can be phase-shifted relative to each other. As another example, the DSP can switch between the output signal and a phase-shifted version of the output signal that is demodulated by the LO signal. Signal characteristics of the receive signal as demodulated by the two LO signals at different times can be compared relative to each other. The DSP can employ the results of the comparison to calculate compensation components that can include gain and/or DC-offset scalar values associated with each of the in-phase (I) and quadrature-phase (Q) components of one or both of the transmit-path and the receive-path. The compensation components are provided to a respective digital predistortion system of the transmit-path and/or receive-path, such that the imbalance of the I- and Q-components can be adaptively corrected.

Figure 1:
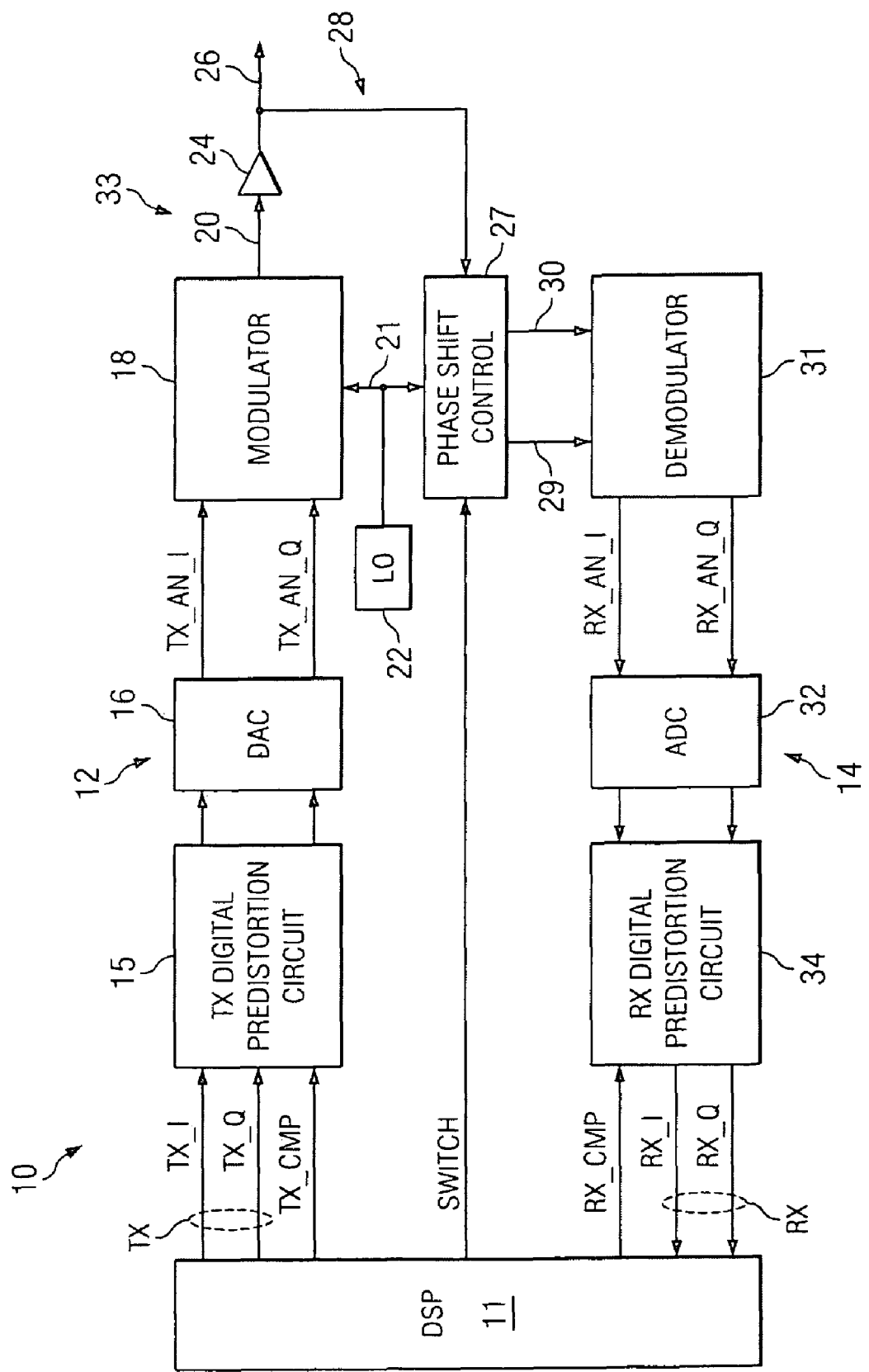
FIG. 1 illustrates an example of a communication system in accordance with an aspect of the invention.

FIG. 1 illustrates an example of a communication system 10 in accordance with an aspect of the invention. The communication system 10 can be implemented in any of a variety of wireless communication devices, such as a portable telephone or a wireless modem. The communication system 10 includes a digital signal processor 11 that is configured to generate a transmit signal TX for transmission and to process a received signal RX. The transmit signal TX is provided on a transmit-path 12 and the receive signal RX is received on a receive-path 14.

The example of FIG. 1 demonstrates that the transmit signal TX is modulated into I- and Q-components. The I- and Q-components, demonstrated in the example of FIG. 1 as TX_I and TX_Q, can collectively form an information carrying baseband signal that is upconverted into a stream of digital samples. The transmit signals TX_I and TX_Q are provided to a transmit-path digital predistortion circuit 15. The transmit-path digital predistortion circuit 15 is configured to compensate for distortion of the output signal of the communication system 10, such as to correct a gain and/or DC-offset imbalance of the transmit signals TX_I and TX_Q, as described herein.

The output of the transmit-path digital predistortion circuit 15 is provided to a digital to analog converter (DAC) 16. The DAC 16 is configured to convert the stream of digital samples of the transmit signals TX_I and TX_Q into an analog signal pair, demonstrated in the example of FIG. 1 as TX_AN_I and TX_AN_Q. The analog signal pair TX_AN_I and TX_AN_Q is provided to a modulator 18 that is configured to mix the analog transmit signals TX_AN_I and TX_AN_Q into a radio frequency (RF) signal 20 based on a local oscillator (LO) signal 21. As an example, the modulator 18 can include any of a variety of devices that are configured to modulate the analog transmit signals TX_AN_I and TX_AN_Q, such as a mixer or an upconverter. In the example of FIG. 1, the LO signal 21 is generated from an LO 22. As an example, I- and Q-components of the LO signal can be mixed with the analog transmit signals TX_AN_I and TX_AN_Q and combined to generate the RF signal 20. The RF signal 20 is amplified by an amplifier 24 and is provided as an output signal 26 for transmission. As an example, the output signal 26 can be provided to a duplexer that is coupled to an antenna (not shown), such that the output signal 26 is wirelessly transmitted from the antenna.

The communication system 10 includes a phase-shift control component 27. In the example of FIG. 1, the phase-shift control component 27 receives the output signal 26 provided in an observation path 28 and the LO signal 21. The phase-shift control component 27 is configured to modify or phase-shift one of the LO signal 21 and the output signal 26 to generate a modified LO signal 29 and a modified output signal 30. It is to be understood that, because the phase-shift control component 27 is configured to modify or phase-shift just one of the LO signal 21 and the output signal 26, one of the modified LO signal 29 and the modified output signal 30 may not actually be "modified", in that such signal can be substantially identical to the respective one of the LO signal 21 or the output signal 26. That is, the unmodified signal (e.g., corresponding to either the LO signal 21 or the output signal 26) passes unchanged through the phase-shift control component 27. The phase-shift control component 27 in turn provides the signal 29 and the signal 30 to a demodulator 31 that is configured to reverse-mix the modified output signal 30 into analog receive signal components RX_AN_I and RX_AN_Q. As described herein, reverse-mixing can refer to reversing a mixing operation that has been performed on the signal, such as downconverting a signal that has been upconverted. The analog receive signals RX_AN_I and RX_AN_Q are provided to an analog-to-digital converter (ADC) 32. The modulator 18, the demodulator 31, the LO 22, the phase-shift control component 27, and the amplifier 24 collectively constitute an analog front-end system 33.

The downconversion of the modified output signal 30 is based on the modified LO signal 29 that is generated from the LO 22 and/or the phase-shift control component 27. For example, the phase-shift control component 27 can provide the modified LO signal 29 as a first LO signal during a first time duration and a second LO signal during a second time duration. The first LO signal can be the LO signal 21 that is implemented for the upconversion of the analog transmit-signals TX_AN_I and TX_AN_Q by the demodulator 18. As an example, the first LO signal and the second LO signal can be phase-shifted relative to each other, can be generated from separate local oscillators, or can be based on generating and/or mixing separate signals, as is described herein. As another example, the phase-shift control component 27 can provide the modified LO signal 29 as the LO signal 21 during both the first time duration and the second time duration. The phase-shift control component can provide the output signal 30 as an unmodified version of the output signal 26 during the first time duration and as an adjusted version (e.g., phase-shifted and/or mixed) of the output signal 26 during the second time duration.

The ADC 32 is configured to convert the analog receive signals RX_AN_I and RX_AN_Q into a stream of digital samples of the receive signal RX, demonstrated in the example of FIG. 1 as an I- and Q-component receive signal pair RX_I and RX_Q. The receive signals RX_I and RX_Q are provided to a receive-path digital predistortion circuit 34. Like the transmit-path digital predistortion circuit 15, the receive-path digital predistortion circuit 34 is configured to compensate for distortion of the receive signal pair from the ADC 32, such as could be introduced by the demodulator 31 and/or the ADC 32. The receive signals RX_I and RX_Q are thus provided to the DSP 11 for processing.

The DSP 11 can be configured to monitor signal characteristics of the receive signal RX to determine the presence of distortion, such as a gain and/or DC-offset imbalance of the receive signal RX. As an example, the DSP 11 can periodically generate a test signal on the transmit-path 12 and can monitor the signal characteristics of the test signal via the observation path 28 and through the receive-path 14. However, DSP 11 detects the distortion that is present in the receive signal RX. As a result, the source of the distortion may initially be unknown. As an example, distortion can be introduced in the transmit-path 12, such as via the DAC 16, the modulator 18, and/or the amplifier 24, or in the receive-path 14, such as via the demodulator 31 and/or the ADC 32. Therefore, the DSP 11 can compensate for the distortion upon ascertaining the amount of distortion that is introduced in each of the transmit-path 12 and the receive-path 14.

The DSP 11 is therefore configured to provide a signal to the phase-shift control component 27, which signal is demonstrated in the example of FIG. 1 as a SWITCH signal. The SWITCH signal can be an activation signal for a physical switch or can be a control signal for a microcontroller within the phase-shift control component 27. As an example, the SWITCH signal can be utilized by the phase-shift control component 27 to switch the modified LO signal 29 between a first LO signal during the first time duration and a second LO signal during the second time duration for demodulating the modified output signal 30 that is substantially identical to the output signal 26. As another example, the SWITCH signal can be utilized by the phase-shift control component 27 to switch the modified output signal 30 between the output signal 26 during the first time duration and an adjusted version of the output signal 26 during the second time duration for demodulation based on the modified LO signal 29 that is substantially identical to the LO signal 26. The DSP 11 can monitor the receive signal RX during the first time duration to determine a set of signal characteristics of the receive signal RX. Subsequently, the DSP 11 can switch the phase-shift control component 27 during the second time duration to determine a second set of signal characteristics of the receive signal RX. The signal characteristics can include any of a variety of measurable characteristics of the received signal RX (e.g. amplitude, phase, frequency and the like).

As an example, the signal characteristics can include a comparison of the transmitted test signal with the subsequently received signal. Specifically, the receive signal RX is a delayed version of the transmit signal TX that has been provided through the transmit-path 12 and the receive-path 14. Therefore, differences between the transmit signal TX and the receive signal RX result from the distortion in the transmit-path 12 and/or the receive-path 14. Accordingly, signal characteristics can be ascertained by subtracting the receive signal RX from a time-delayed transmit signal TX, such that the transmit signal TX and the receive signal RX are substantially time synchronized. Phase-noise can thus be measured from a transfer function of the resultant difference in the signals.

As described above, the signal characteristics of the receive signal RX during the first time duration are compared with the signal characteristics of the receive signal RX during the second time duration. The differences between the signal characteristics during each of the times can be implemented by the DSP 11 to ascertain the contribution of each of the transmit-path 12 and the receive-path 14 to the distortion of the receive signal RX. As an example, the second LO signal can be a phase-shifted version of the first LO signal, such as by 90°. As an example, a phase-shift and/or other difference between the first LO signal and the second LO signal can be predefined. As a result, the magnitude of the imbalance of gain and/or DC-offset of the transmit-path 12 and the receive-path 14 can be isolated from each other based on the applying the first LO signal during the first time duration and the second LO signal during the second time duration. The first and second time durations can be considered different stages of a test or calibration mode performed by the system 10, which can be implemented during normal operation of the system.

As described above, the DSP 11 obtains a first set of signal characteristics during the first time duration and a second set of signal characteristics during the second time duration. The DSP 11 then compares the first set of signal characteristics with the second set of signal characteristics. If the DSP 11 determines that there is substantially no change in the signal characteristics between the first and second time durations, the DSP 11 can identify that the distortion that is present in the receive signal RX is introduced entirely in the receive-path 14. However, if the DSP 11 determines that there is a change in the signal characteristics between the first and second time durations that is commensurate with the difference between the first LO signal and the second LO signal (e.g., phase difference), the DSP 11 can identify that the distortion that is present in the receive signal RX is introduced entirely in the transmit-path 12. Measurable variations between substantially no difference and a difference that is commensurate with the difference between the first LO signal and the second LO signal can thus be used by the DSP 11 to calculate separate contributions to the distortion by both the transmit-path 12 and the receive-path 14.

Upon determining the contribution of the transmit-path 12 and the receive-path 14 with regard to the distortion of the receive signal RX, the DSP 11 can calculate a set of compensation components that correspond to the respective contributions of the distortion. For example, the compensation components can include scalar values of gain and/or DC-offset for the I- and Q-components of each of the transmit signal TX and the receive signal RX. The compensation components are provided to the transmit-path and receive-path digital predistortion circuits 15 and 34, demonstrated in the example of FIG. 1, respectively, as TX_CMP and RX_CMP. Therefore, the compensation components TX_CMP and RX_CMP can be applied to the respective transmit signal TX and receive signal RX to compensate for the contributions of each of the transmit-path 12 and the receive-path 14 to the distortion of the receive signal RX.

The DSP 11 can control when or under what circumstances distortion compensation is to be performed. For example, the DSP 11 can be configured to perform distortion compensation periodically, such as based on the passage of a predetermined amount of time, or in response to a triggered event, such as transmission of signals in real time. As an example, the DSP 11 can be configured to monitor the receive signal RX and perform the appropriate compensation component calculations once for each of a predetermined number of transmissions, such as voice transmissions from the wireless communication system 10. Thus, the receive signal RX that is monitored by the DSP 11 can include a voice or data signal that is transmitted by the wireless communication system 10 in real time. Accordingly, because the DSP 11 can automatically monitor the receive signal RX and perform the appropriate compensation component calculations, the DSP 11 can adaptively compensate for distortion resulting from temperature and semiconductor aging effects that can occur subsequent to initial manufacturer testing of the communication system 10. Furthermore, the compensation components can be generated and provided to the transmit-path digital predistortion circuit 15 and the receive-path digital predistortion circuit 34 individually, and the compensation components can be calculated and set to any desired values to ensure appropriate frequency and group-delay response. Accordingly, factory calibration of the communication system 10 may not be necessary, as the communication system 10 may perform the calibration dynamically during real-time operation. As a result, time and cost can be minimized at the production phase.

It is to be understood that the communication system 10 is not intended to be limited to the example of FIG. 1. As an example, the communication system 10 is presented in the example of FIG. 1 as a simplistic overview of a communication system, such that one or more additional components may likewise be included and incorporated into the communication system 10. In addition, it is to be understood that the communication system 10 is not intended to be limited to a homodyne communication system, but can be implemented in a heterodyne communication system, as well. Furthermore, it is to be understood that the distortion compensation described herein is not limited to implementation in a wireless communication system, but can also be implemented in a wired communication system. Therefore, the communication system 10 can be configured in any of a variety of ways.

Figure 2:
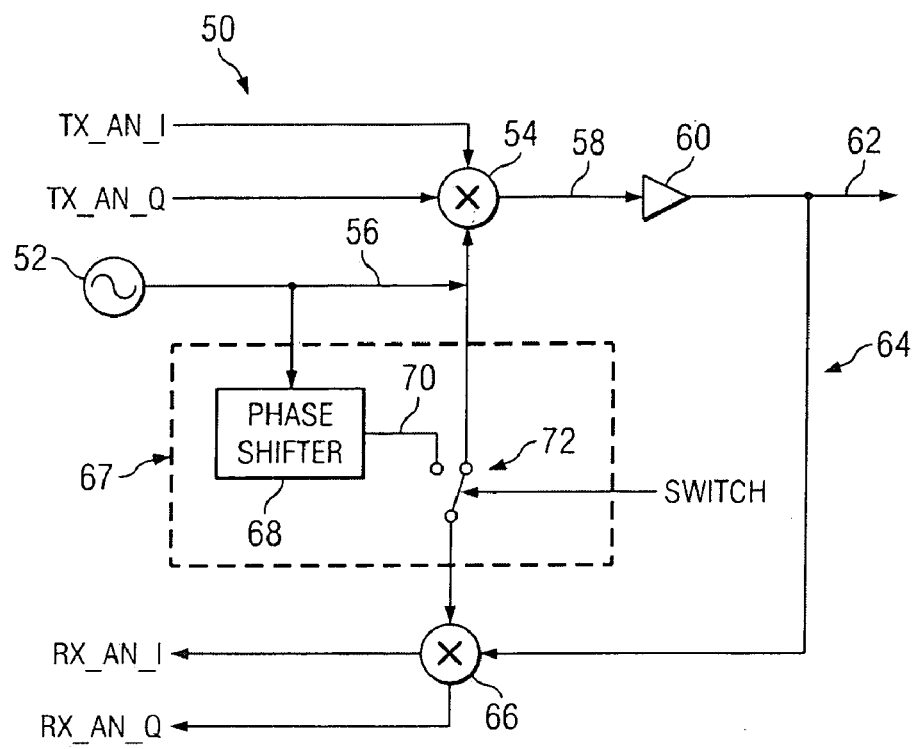
FIG. 2 illustrates an example of an analog front-end system in accordance with an aspect of the invention.

FIG. 2 illustrates an example of an analog front-end system 50 in accordance with an aspect of the invention. The analog front-end system 50 can be implemented as the analog front-end system 33 in the example of FIG. 1. Therefore, reference is made to the example of FIG. 1 in the following discussion of the example of FIG. 2.

The analog front-end system 50 includes an LO 52 and a transmit-path mixer 54. The transmit-path mixer 54 is configured to upconvert the transmit signals TX_AN_I and TX_AN_Q based on a first LO signal 56 that is output from the LO 52 to generate an RF signal 58. As an example, I- and Q-components of the first LO signal 56 (not shown for simplicity) can be mixed with the analog transmit signals TX_AN_I and TX_AN_Q and combined to generate the RF signal 58. The RF signal 58 is amplified by an amplifier 60 and is provided as an output signal 62 for wireless transmission. As an example, the output signal 62 can be provided to a duplexer (not shown) that is coupled to an antenna (not shown), such that the output signal 62 is wirelessly transmitted from the antenna.

The output signal 62 is also provided in an observation path 64 to a receive-path mixer 66 that is configured to downconvert the output signal 62 into analog receive signals RX_AN_I and RX_AN_Q. The analog front-end system 50 also includes a phase-shift control component 67. The phase-shift control component 67 includes a phase-shifter 68 having a predefined phase-shift function (e.g., about 90°). The phase-shifter 68 is configured to receive the first LO signal 56 and to phase-shift the first LO signal 56 by the predefined phase-shift function to generate a second LO signal 70.

The phase-shift control component 67 further includes a switch 72 that is controlled by the SWITCH signal to couple the receive-path mixer 66 to either the first LO signal 56 or the second LO signal 70. As described above in the example of FIG. 1, the SWITCH signal can be provided by the DSP 11, such as to control which of the first LO signal 56 and the second LO signal 70 is provided to the receive-path mixer 66. The DSP 11 is configured to monitor the receive signal RX during the respective time durations that each of the first LO signal 56 and the second LO signal 70 are provided to the receive-path mixer 66. The downconversion of the output signal 62 can therefore be based on the first LO signal 56 during a first time duration and based on the second LO signal 70 during a second time duration, such as dictated by the SWITCH signal. As a result, because the phase-shift function is predefined, the magnitude of the imbalance of gain and/or DC-offset of the transmit-path 12 and the receive-path 14 can be isolated from each other based on the activation of the switch 72 during the first and the second time duration. Specifically, the known phase-shift of the second LO signal 70 relative to the first LO signal 56 enables the DSP 11 to calculate separate compensation components for each of the transmit-path 12 and the receive-path 14 based on the monitored signal characteristics of the receive signal RX during each of the first time duration and the second duration.

Figure 3:
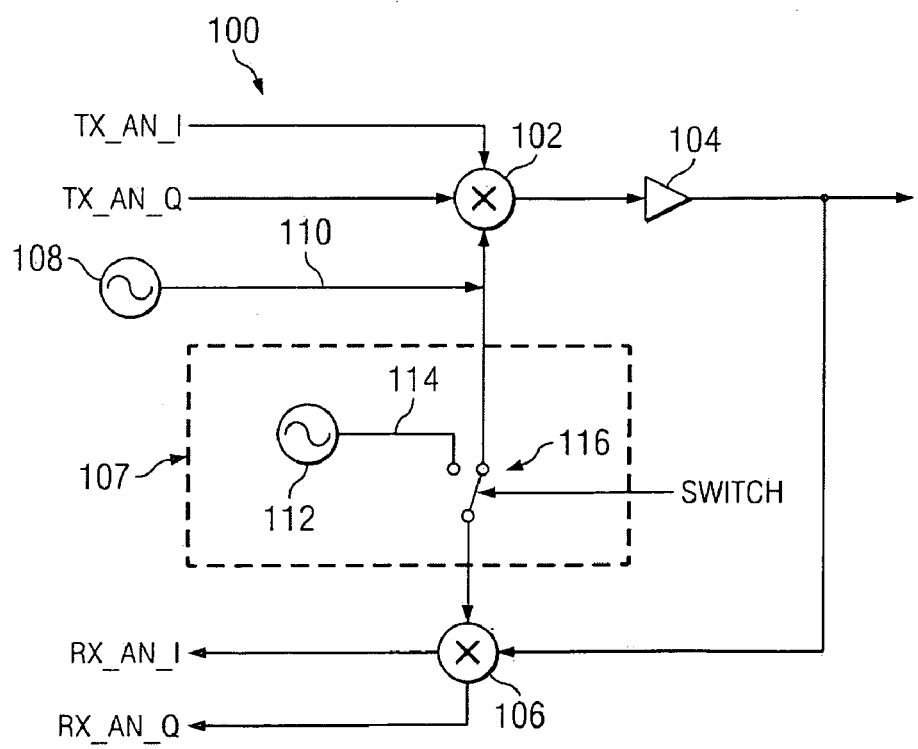
FIG. 3 illustrates another example of an analog front-end system in accordance with an aspect of the invention.

FIG. 3 illustrates another example of an analog front-end system 100 in accordance with an aspect of the invention. The analog front-end system 100 can be implemented as the analog front-end system 33 in the example of FIG. 1. Therefore, reference is to be made to the example of FIG. 1 in the following discussion of the example of FIG. 3.

The analog front-end system 100 is configured substantially similar to the analog front-end system 50 in the example of FIG. 2. The analog front-end system 100 includes a transmit-path mixer 102, an amplifier 104, and a receive-path mixer 106 that are each configured substantially similar to the transmit-path mixer 54, the amplifier 60, and the receive-path mixer 66, respectively, in the example of FIG. 2. The analog front-end system 100 also includes a phase-shift control component 107, and an LO 108 is configured to provide a first LO signal 110. However, instead of including a phase-shifter (e.g., the phase shifter 68 in the example of FIG. 1), the phase-shift control component 107 includes a second LO 112 configured to provide a second LO signal 114. The SWITCH signal activates a switch 116 to couple a selected one of the first LO signal 110 and the second LO signal 114 to the receive-path mixer 106, similar to as described above in the example of FIG. 2. For instance, during the first time duration, the switch 116 is activated such that the first LO signal 110 is provided to the transmit-path mixer 102 and the receive-path mixer 106. During the second time duration, the switch 116 is activated such that the first LO signal 110 is provided to the transmit-path mixer 102 and the second LO signal 114 is provided to the receive-path mixer 106.

The first LO signal 110 and the second LO signal 114 can be substantially similar and can be phase-shifted relative to each other. The amount of the phase-shift can be predefined, such that the DSP 11 can calculate separate compensation components for each of the transmit-path 12 and the receive-path 14 based on the monitored signal characteristics of the receive signal RX during each of the first time duration and the second duration. As another example, the first LO signal 110 and the second LO signal 114 can vary in other manners instead of or in addition to phase. For example, the second LO signal 114 can have a frequency and/or amplitude that differs from the first LO signal 110 by a predefined magnitude. Therefore, the example of FIG. 3 demonstrates an alternative approach in which separate LO signals can be employed to demodulate the output signal to obtain separate receive signal characteristics.

Figure 4:
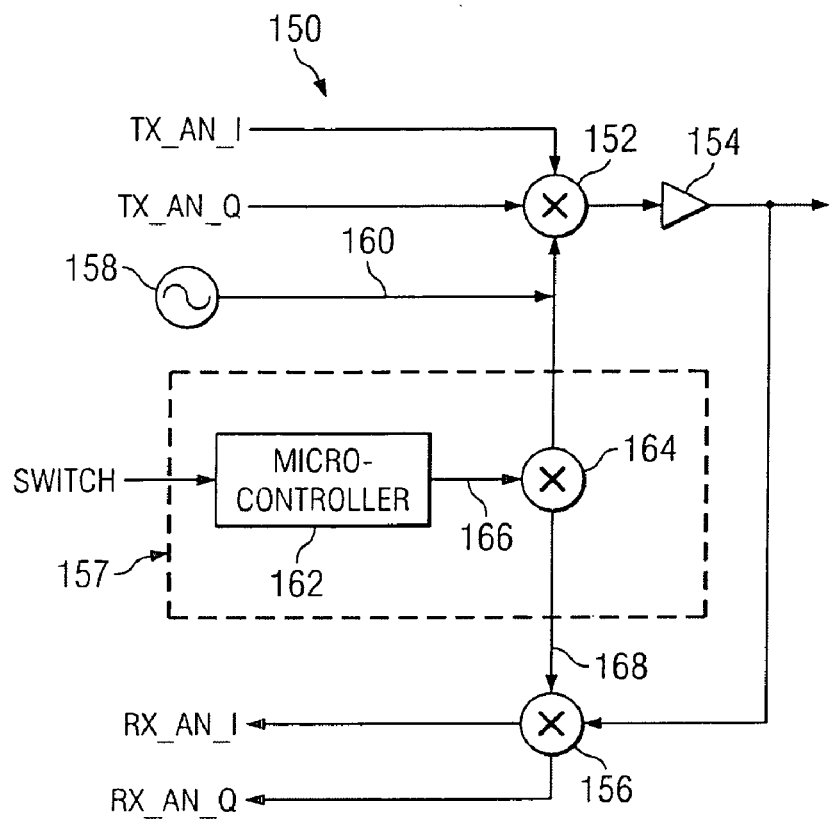
FIG. 4 illustrates yet another example of an analog front-end system in accordance with an aspect of the invention.

FIG. 4 illustrates another example of an analog front-end system 150 in accordance with an aspect of the invention. The analog front-end system 150 can be implemented as the analog front-end system 33 in the example of FIG. 1. Therefore, reference is to be made to the example of FIG. 1 in the following discussion of the example of FIG. 4.

The analog front-end system 150 is configured substantially similar to the analog front-end system 50 in the example of FIG. 2. The analog front-end system 150 includes a transmit-path mixer 152, an amplifier 154, and a receive-path mixer 156 that are each configured substantially similar to the transmit-path mixer 54, the amplifier 60, and the receive-path mixer 66, respectively, in the example of FIG. 2. The analog front-end system 150 also includes a phase-shift control component 157, and an LO 158 that is configured to provide a first LO signal 160. However, instead of a phase-shifter and a switch (e.g., the phase shifter 68 and switch 72 in the example of FIG. 1), the phase-shift control component 157 includes a microcontroller 162 and mixer 164. The microcontroller 162 is configured to generate a low-frequency signal 166 in response to the SWITCH signal. For example, the SWITCH signal can be configured to activate and deactivate the microcontroller 162. When the microcontroller 162 is activated, the mixer 164 can therefore mix the first LO signal 160 with the low-frequency signal 166 to generate a second LO signal 168 during the second time duration. When the microcontroller 162 is deactivated, the mixer 164 can be configured to provide a null signal during the first time duration, such that the mixer 164 provides an output signal that is substantially the same as the first LO signal 160. Therefore, during the first time duration, the first LO signal 160 is provided to the transmit-path mixer 152 and the receive-path mixer 156. During the second time duration, the first LO signal 160 is provided to the transmit-path mixer 152 and the second LO signal 168 is provided to the receive-path mixer 156.

As described herein, the different LO signals enable the DSP 11 to ascertain respective distortion contributions of the transmit-path 12 and the receive-path 14 for implementing appropriate compensation. As an example, the low-frequency signal 166 can be a signal having predefined attributes regarding frequency and/or amplitude. As another example, the low-frequency signal 166 can have signal attributes that are controlled by DSP 11 via the SWITCH signal. In either example, the low-frequency signal 166 has attributes that are known by the DSP 11. As such, the differences between the first LO signal 160 and the second LO signal 168 can likewise be known by the DSP 11 for the purpose of calculating separate compensation components for each of the transmit-path 12 and the receive-path 14 based on the monitored signal characteristics of the receive signal RX during each of the first time duration and the second duration. Therefore, the example of FIG. 4 provides an alternative manner in which separate LO signals can be employed to demodulate the output signal to obtain separate receive signal characteristics.

Figure 5:
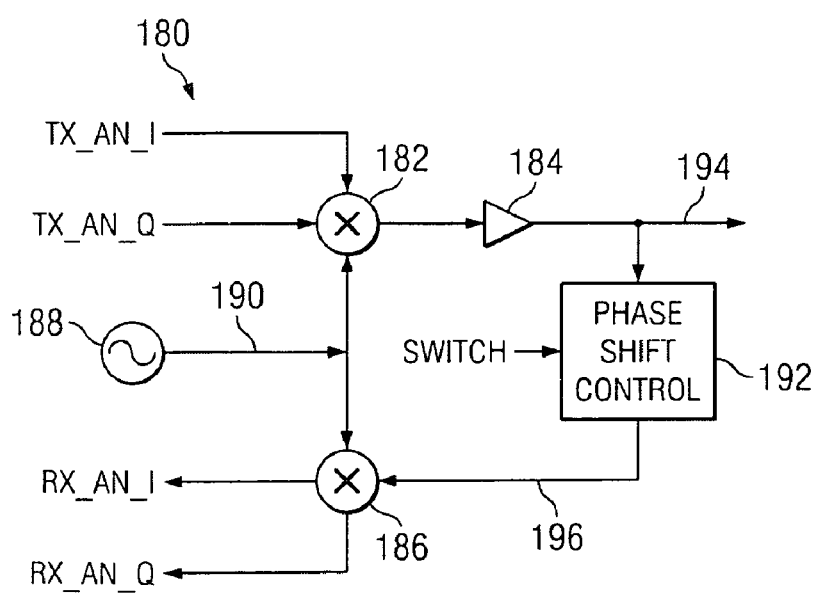
FIG. 5 illustrates yet another example of an analog front-end system in accordance with an aspect of the invention.

FIG. 5 illustrates yet another example of an analog front-end system 180 in accordance with an aspect of the invention. The analog front-end system 180 can be implemented as the analog front-end system 33 in the example of FIG. 1. Therefore, reference is to be made to the example of FIG. 1 in the following discussion of the example of FIG. 5.

The analog front-end system 180 includes a transmit-path mixer 182, an amplifier 184, and a receive-path mixer 186 that are each configured substantially similar to the transmit-path mixer 54, the amplifier 60, and the receive-path mixer 66, respectively, in the example of FIG. 2. The analog front-end system 180 also includes an LO 188 that is configured to provide an LO signal 190 to both the transmit-path mixer 182 and the receive-path mixer 186. In addition, the analog front-end system 180 includes a phase-shift control component 192 that receives an output signal 194 from the amplifier 184 and provides an output signal 196 to the receive-path mixer 186, which output signal varies according to a SWITCH signal. For instance, the SWITCH signal controls the phase-shift control component to provide either an unmodified version or an adjusted (e.g., phase-shifted) version of the output signal 194 provided at the output of the amplifier 154.

In the example of FIG. 5, the phase-shift control component 192 can be configured substantially similar to the phase-shift control components 67, 107, and 167 in any of the respective examples of FIGS. 2-4. Specifically, as an example, the phase-shift control component 192 can include a phase-shifter that is configured to phase-shift the output signal 194 to provide the modified output signal 196. As another example, the phase-shift control component 192 can include an additional LO and switch that are configured to provide an LO signal that is mixed with the output signal 194 to generate the modified output signal 196. As yet another example, the phase-shift control component 192 can include a microcontroller that is configured to generate a low-frequency signal that is mixed with the output signal 194 to generate the modified output signal 196. The phase-shift control component 192 can also include a switch that is responsive to the SWITCH signal, such as provided from a DSP (e.g. the DSP 11 in the example of FIG. 1) or from other types of suitable control circuitry. As such, the modified output signal 196 can be provided to the receive-path mixer 186 as substantially identical to the output signal 194 during the first time duration, and that the modified output signal 196 can be provided to the receive-path mixer 186 as the adjusted (e.g., phase-shifted and/or mixed) version of the output signal 194 during the second time duration. Accordingly, in contrast to as described above in the examples of FIGS. 2-4, the signal characteristics of the transmit-path and the receive-path can be isolated based on modifying the output signal 194, and not based on modifying the LO signal 190.

Figure 6:
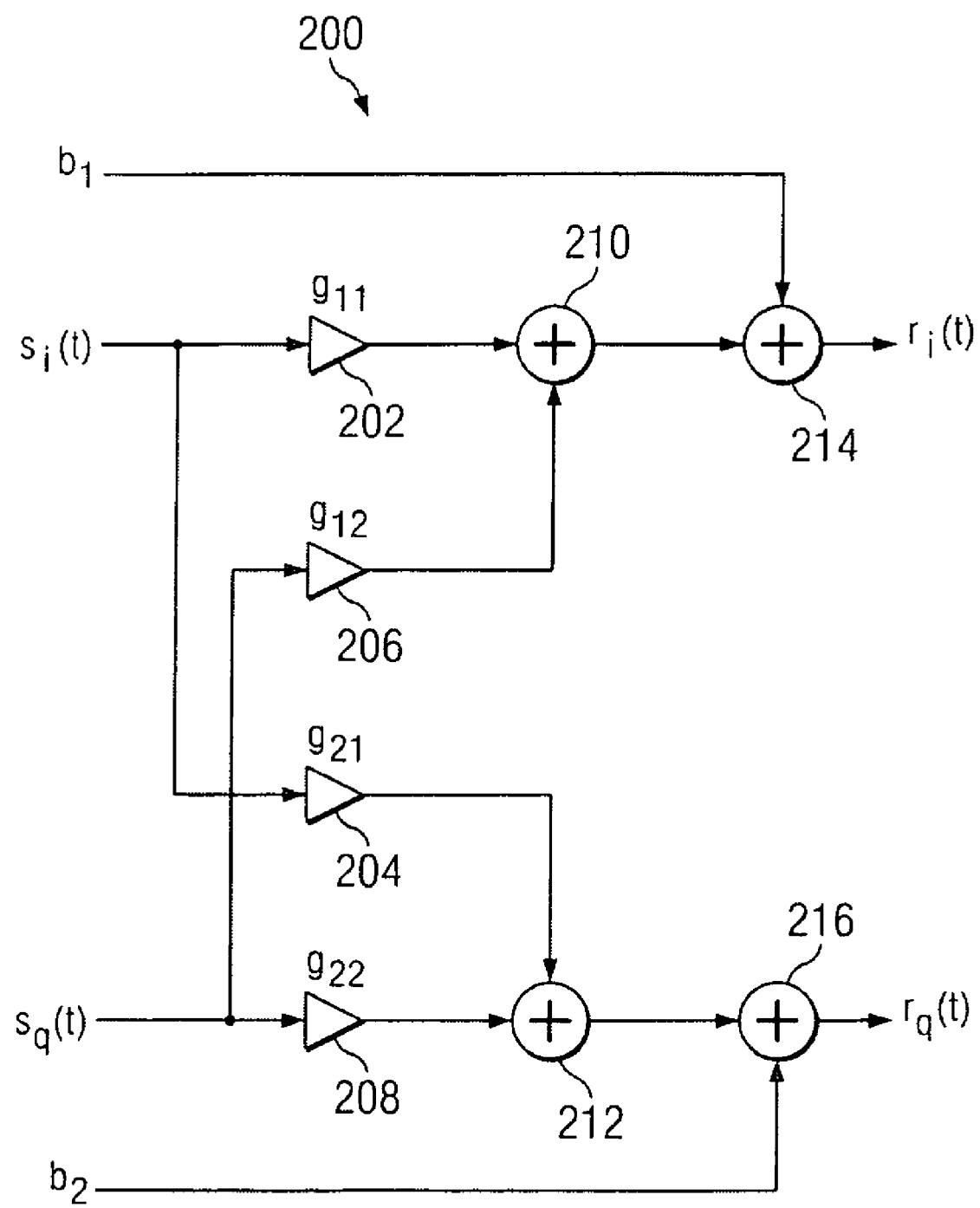
FIG. 6 illustrates an example of a digital predistortion circuit in accordance with an aspect of the invention.

FIG. 6 illustrates an example of a digital predistortion circuit 200 in accordance with an aspect of the invention. The digital predistortion circuit 200 can be implemented as either of the transmit-path digital predistortion circuit 15 or the receive-path digital predistortion circuit 34 in the example of FIG. 1. Therefore, reference may be made to the example of FIG. 1 in the following discussion of the example of FIG. 6.

The digital predistortion circuit 200 receives an input signal s(t) that is divided into I- and Q-components, such that the input signal is demonstrated in the example of FIG. 6 as $s_i(t)$ and $s_q(t)$. The input signal s(t) can correspond to a stream of digital samples of either the transmit signals TX_I and TX_Q or the receive signals RX_I and RX_Q. The I-component of the input signal $s_i(t)$ is provided to an amplifier 202 and an amplifier 204, and the Q-component of the input signal $s_q(t)$ is provided to an amplifier 206 and an amplifier 208. As demonstrated in the example of FIG. 6, the amplifier 202 is configured to provide a gain of $g_{11}$, the amplifier 204 is configured to provide a gain of $g_{21}$, the amplifier 206 is configured to provide a gain of $g_{12}$, and the amplifier 208 is configured to provide a gain of $g_{22}$. The gains $g_{11}$, $g_{12}$, $g_{21}$, and $g_{22}$ can each be scalar values that are set by the DSP 11 and provided to the digital predistortion circuit 200 to correct a potential gain imbalance of the signals $s_i(t)$ and $s_q(t)$.

The amplified outputs of the amplifiers 202 and 206 are provided to a summer 210, and the amplified outputs of the amplifiers 204 and 208 are provided to a summer 212. The summers 210 and 212 thus each add the respective amplified signals $s_i(t)$ and $s_q(t)$ together to achieve the balanced magnitudes. The outputs of each of the summers 210 and 212 are provided to a respective additional pair of summers 214 and 216. The summer 214 adds the output of the summer 210 with a DC-offset value $b_1$, and the summer 216 adds the output of the summer 212 with a DC-offset value $b_2$. The DC-offset values $b_1$ and $b_2$ are likewise scalar values that are calculated by the DSP 11. The DSP 11 can provide the digital predistortion circuit 200 with values to set the DC-offsets $b_1$ and $b_2$ to correct a potential DC-offset imbalance of the signals $s_i(t)$ and $s_q(t)$.

The outputs of the summers 214 and 216 are provided as predistorted signals $r_i(t)$ and $r_q(t)$. The predistorted signals $r_i(t)$ and $r_q(t)$ are provided to the DAC 16 in the case of the digital predistortion circuit 200 being configured as the transmit-path digital predistortion circuit 15, or provided as the receive signals RX_I and RX_Q in the case of the digital predistortion circuit 200 being configured as the receive-path digital predistortion circuit 34. Equation 1 below describes the mathematical relationship between the signals, as demonstrated in the example of FIG. 6:

$$\begin{bmatrix} r_i(t) \\ r_q(t) \end{bmatrix} = \begin{bmatrix} g_{11} & g_{12} \\ g_{21} & g_{22} \end{bmatrix} \begin{bmatrix} s_i(t) \\ s_q(t) \end{bmatrix} + \begin{bmatrix} b_1 \\ b_2 \end{bmatrix} \qquad \text{Equation 1}$$

Where $r_i(t)$ is the I-component output signal of the digital predistortion circuit 200;

$r_q(t)$ is the Q-component output signal of the digital predistortion circuit 200;

s(t) is the I-component input signal of the digital predistortion circuit 200;

s(t) is the Q-component input signal of the digital predistortion circuit 200;

$g_{11}$ is the gain of the amplifier 202;

$g_{12}$ is the gain of the amplifier 206;

$g_{21}$ is the gain of the amplifier 204;

$g_{22}$ is the gain of the amplifier 208.

Therefore, upon monitoring the signal characteristics of the receive signal during the first time duration and the second time duration, the DSP 11 can employ Equation 1 to calculate the compensation components, such as to set the gains values $g_{11}$, $g_{12}$, $g_{21}$, and $g_{22}$ and the DC-offset values $b_1$ and $b_2$, for each of the transmit-path 12 and the receive-path 14. Accordingly, gain and DC-offset imbalance of the I- and Q-components of the transmit signal TX and the receive signal RX can be corrected.

Figure 7:
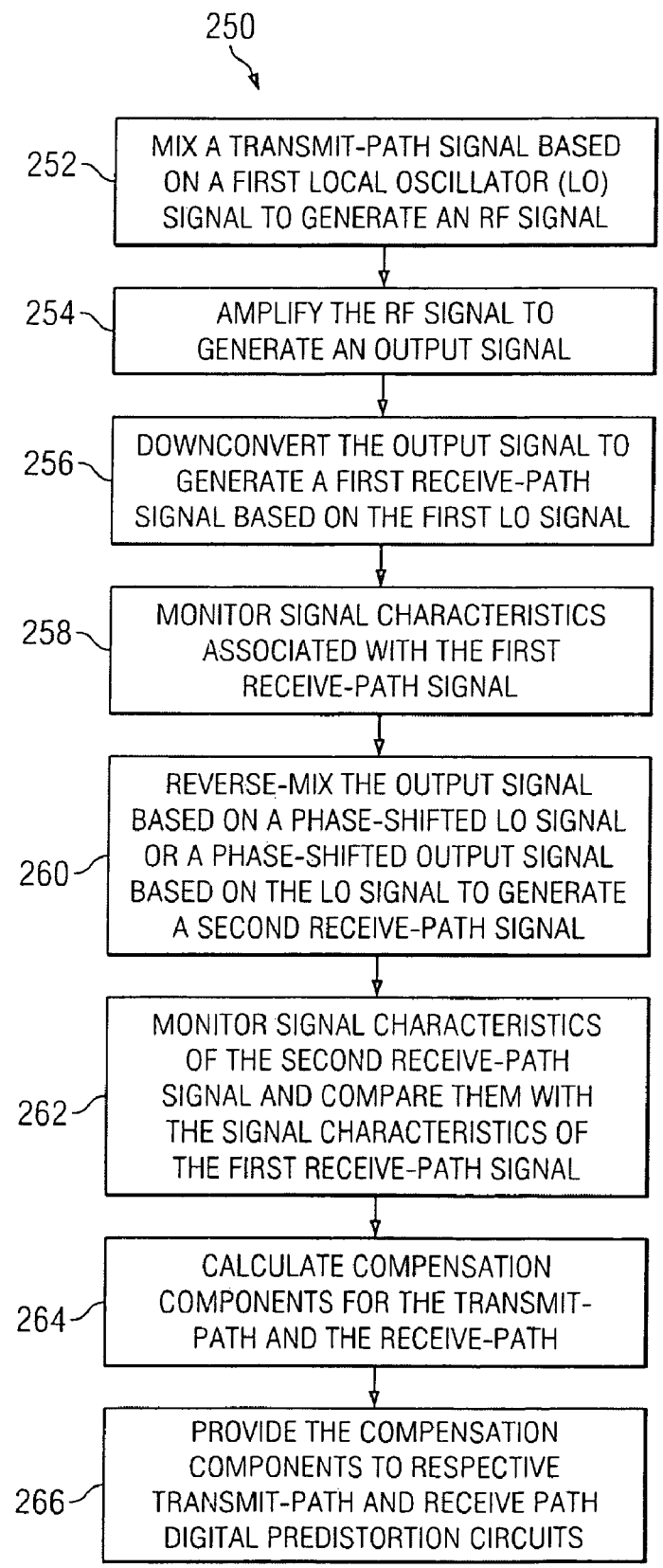
FIG. 7 illustrates an example of a method for correcting in-phase and quadrature-phase imbalance in accordance with an aspect of the invention.

In view of the foregoing structural and functional features described above, certain methods will be better appreciated with reference to FIG. 7. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., analog or digital circuitry, such as may be embodied in an application specific integrated circuit), software (e.g., as executable instructions stored in memory or running on one or more computer systems or a DSP), or any combination of hardware and software.

FIG. 7 illustrates an example of a method 250 for correcting I and Q imbalance in accordance with an aspect of the invention. At 252, a transmit-path signal is mixed based on an LO signal to generate an RF signal. The transmit-path signal can be an analog signal that has been predistorted. The mixing can be upconversion, and can be as a result of mixing a carrier signal output from an LO with the transmit-path signal. At 254, the RF signal is amplified to generate an output signal. The amplification of the RF signal can be to provide a sufficient gain of the RF signal for wireless transmission via an antenna, or for transmission over a physical connection (e.g., a transmission wire).

At 256, the output signal is reverse-mixed to generate a first receive-path signal based on the first LO signal. The reverse-mixing can be downconversion, and can result from a coupling of the receive-path with the output via a feedback observation path. The downconversion of the output signal can be based on providing the LO signal output from the LO having the carrier frequency to a mixer to demodulate the output signal. At 258, signal characteristics associated with the first receive-path signal are monitored. The monitoring can be a function of a DSP that is coupled to both the transmit-path and the receive-path.

At 260, one of the output signal is reverse-mixed based on a phase-shifted version of the LO signal and a phase-shifted version of the output signal is reverse-mixed based on the LO signal to generate a second receive-path signal. As an example, the phase-shifted version of the LO signal can be output from a second LO or can be a signal resulting from mixing a low-frequency signal with the LO signal. Likewise, the phase-shifted version of the output signal can be a signal resulting from mixing the output signal with an LO signal provided from a second LO, or can be a signal resulting from mixing a low-frequency signal with the output signal. At 262, signal characteristics associated with the second receive-path signal are monitored and compared with the signal characteristics of the first receive-path signal. The comparison function can also be performed by the DSP. At 264, compensation components for the transmit-path and the receive-path are calculated. The compensation components can correspond to gain and/or DC-offset associated with the I- and Q-components of each of the transmit-path signal and the receive-path signal. At 266, the compensation components are provided to respective transmit-path and receive-path digital predistortion circuits. The digital predistortion circuits thus correct the I and Q imbalance of each of the transmit-path signal and receive-path signal.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A communication system comprising:
   a modulator configured to mix a transmit-path signal based on a local oscillator (LO) signal;
   an amplifier configured to amplify the mixed transmit-path signal to generate an output signal for transmission;
   a demodulator configured to generate a receive-path signal based on the output signal and the LO signal;
   phase-shift control components configured to provide the output signal and the LO signal to the demodulator during a first time duration and to provide a phase-shifted version of one of the output signal and the LO signal to the demodulator during a second time duration, the demodulator being configured to generate a second receive-path signal based on the one of the phase-shifted output signal and the phase-shifted LO signal during the second time duration; and
   at least one predistortion circuit configured to adjust at least one of the transmit-path signal and the receive-path signal based on a difference in signal characteristics of the receive-path signal during the second time duration relative to the first time duration.

2. The communication system of claim 1, wherein each of the transmit-path signal and the receive-path signal comprise an in-phase component and a quadrature-phase component.

3. The communication system of claim 2, wherein the at least one predistortion circuit is configured to correct an imbalance between the in-phase component and the quadrature-phase component of the at least one of the transmit-path signal and the receive-path signal.

4. The communication system of claim 2, wherein the at least one predistortion circuit is configured to adjust at least one of gain and DC-offset associated with each of the in-phase component and the quadrature-phase component of the at least one of the transmit-path signal and the receive-path signal.

5. The communication system of claim 1, wherein the phase control circuitry comprises a phase-shifter configured to generate the one of the phase-shifted output signal and the phase-shifted LO signal, the demodulator being coupled to the phase-shifter during the second time duration.

6. The communication system of claim 1, further comprising a first local oscillator configured to generate the LO signal and wherein the phase control circuitry comprises a second local oscillator configured to generate the one of the phase-shifted output signal and the phase-shifted LO signal, the demodulator being coupled to the second local oscillator during the second time duration.

7. The communication system of claim 1, wherein the phase control circuitry comprises a microcontroller configured to generate a low-frequency signal that is mixed with one of the LO signal and the output signal to generate the one of the phase-shifted output signal and the phase-shifted LO signal during the second time duration.

8. The communication system of claim 1, further comprising a digital signal processor (DSP) configured to monitor the signal characteristics of the receive-path signal during the first time duration and the second time duration and to calculate at least one compensation component that is provided to the at least one predistortion circuit.

9. The communication system of claim 8, wherein the at least one compensation component comprises a DC-offset and at least one gain associated with each of an in-phase component and a quadrature-phase component associated with the respective at least one of the transmit-path signal and the receive-path signal.

10. The communication system of claim 8, wherein the DSP is configured to periodically monitor the signal characteristics and to periodically calculate the compensation components.

11. The communication system of claim 1, wherein the at least one predistortion circuit comprises a transmit-path predistortion circuit and a receive-path predistortion circuit.

12. A method for correcting in-phase and quadrature-phase imbalance associated with at least one of a transmit-path signal and a receive-path signal, the method comprising:
mixing the transmit-path signal with a local oscillator (LO) signal to generate a radio frequency (RF) signal;
amplifying the RF signal to generate an output signal for transmission;
reverse-mixing the output signal to generate a first receive-path signal based on the LO signal;
monitoring signal characteristics associated with the first receive-path signal;
reverse-mixing one of the output signal based on a phase-shifted version of the LO signal and a phase-shifted version of the output signal based on the LO signal to generate a second receive-path signal;
monitoring signal characteristics associated with the second receive-path signal; and
adjusting at least one of the transmit-path signal and the receive-path signal based on a difference in the monitored signal characteristics of the first receive-path signal and the monitored signal characteristics of the second receive-path signal.

13. The method of claim 12, wherein adjusting the at least one of the transmit-path signal and the receive-path signal comprises adjusting at least one of a DC-offset and at least one gain associated with each of an in-phase component and a quadrature-phase component of the at least one of the transmit-path signal and the receive-path signal.

14. The method of claim 12, further comprising:
generating the LO signal from a first local oscillator; and
generating the phase-shifted version of the LO signal from a second local oscillator;
wherein the reverse-mixing comprises switching between the first local oscillator to generate the first receive-path signal during a first time duration and the second local oscillator to generate the second receive-path signal during a second time duration.

15. The method of claim 12, further comprising:
generating the LO signal from a first local oscillator; and
mixing the output signal with a second LO signal generated from a second local oscillator to generate the phase-shifted version of the output signal;
wherein the reverse-mixing comprises reverse-mixing the output signal based on the LO signal to generate the first receive-path signal during a first time duration and reverse-mixing the phase-shifted version of the output signal based on the LO signal to generate the second receive-path signal during a second time duration.

16. The method of claim 12, further comprising mixing one of the LO signal and the output signal with a low-frequency signal to generate the respective one of the phase-shifted version of the LO signal and the phase-shifted version of the output signal.

17. A communication system comprising:
means for mixing a transmit-path signal with a local oscillator (LO) signal to generate a radio frequency (RF) signal;
means for amplifying the RF signal to generate an output signal;
means for reverse-mixing the output signal based on the LO signal during a first time duration and for reverse-mixing one of the output signal based on a phase-shifted version of the LO signal and a phase-shifted version of the output signal based on the LO signal to generate the receive-path signal during a second time duration;
means for monitoring signal characteristics associated with the receive-path signal during the first time duration and the second time duration; and
means for adjusting at least one of the transmit-path signal and the receive-path signal based on a difference in the signal characteristics of the receive-path signal during the second time duration relative to the first time duration.

18. The communication system of claim 17, further comprising:
means for phase-shifting one of the LO signal and the output signal; and
means for switching between one of the LO signal and the output signal during the first time duration and one of the phase-shifted version of the LO signal and the phase-shifted version of the output signal during the second time duration.

19. The communication system of claim 17, further comprising:
means for generating a low-frequency signal; and
means for mixing the low-frequency signal with one of the LO signal and the output signal during the second time duration.

20. The communication system of claim 17, further comprising:
means for generating the LO signal; and
means for generating a second LO signal, which is separate from the means for generating the LO signal, the second LO signal being configured to generate one of the phase-shifted version of the LO signal and the phase-shifted version of the output signal.

* * * * *